(12) United States Patent
Takeuchi

(10) Patent No.: US 6,686,948 B2
(45) Date of Patent: Feb. 3, 2004

(54) LASER IMAGING APPARATUS

(75) Inventor: Shuichi Takeuchi, Saitama-ken (JP)

(73) Assignee: Pentax Corporation, Tokyo (JP)

( * ) Notice: Subject to any disclaimer, the term of this patent is extended or adjusted under 35 U.S.C. 154(b) by 22 days.

(21) Appl. No.: 10/025,551

(22) Filed: Dec. 26, 2001

(65) Prior Publication Data

US 2002/0080459 A1 Jun. 27, 2002

(30) Foreign Application Priority Data

Dec. 25, 2000 (JP) ........................................ 2000-392504

(51) Int. Cl.[7] .............................. B41J 15/14; B41J 27/00
(52) U.S. Cl. ........................................ 347/244; 347/259
(58) Field of Search ................................ 347/238, 241, 347/243, 244, 256, 258, 260, 259; 359/212

(56) References Cited

U.S. PATENT DOCUMENTS 5,194,981 A * 3/1993 Morimoto .................... 359/212
5,805,198 A    9/1998 Nonaka et al. ............ 347/234
6,326,609 B1  12/2001 Takauchi .................... 250/234

* cited by examiner

Primary Examiner—Hai Pham
(74) Attorney, Agent, or Firm—Greenblum & Bernstein, P.L.C.

(57) ABSTRACT

A laser imaging apparatus is provided with a laser source, a relaying optical system, a deflector having at least one deflecting surface, an imaging optical system that converges the laser beam to form a beam spot on a surface to be scanned. An optical axis of the relaying optical system and an optical axis of the imaging optical system intersect at a deflection reference point which is located in the vicinity of a deflecting surface on which the laser beam is incident. The laser imaging apparatus further includes first and second adjusting systems that compensates for an inclination error and a positional error of the laser beam incident on the deflecting surface, respectively. The first and second adjusting systems are provided in the relaying optical system.

18 Claims, 7 Drawing Sheets

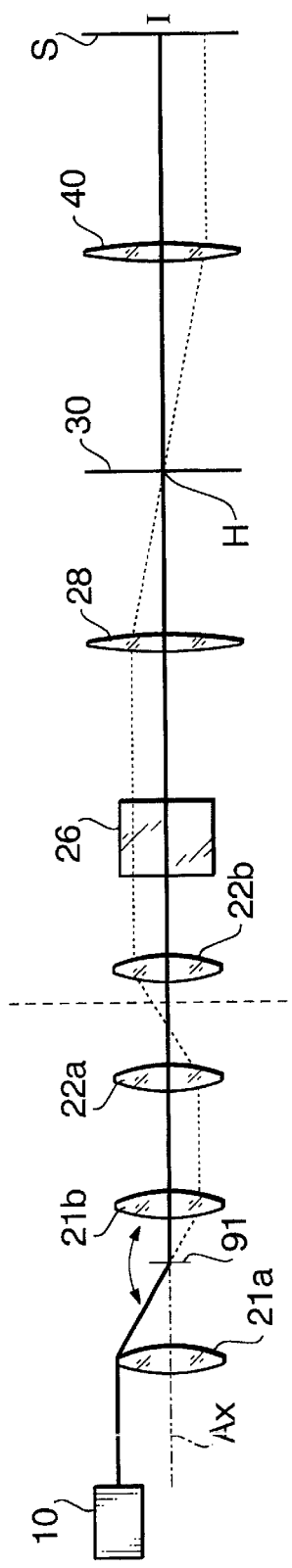
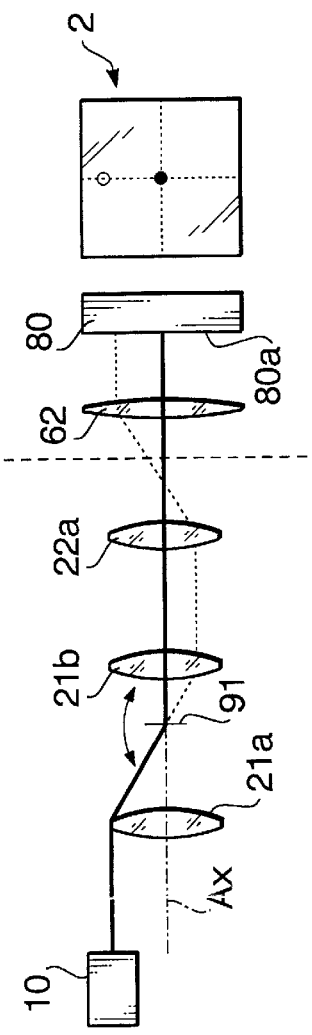

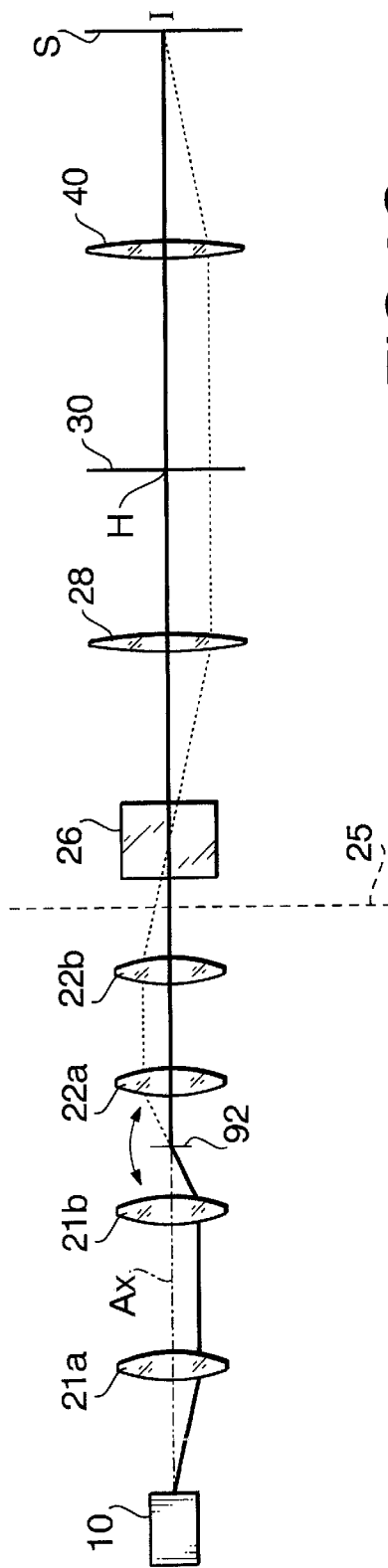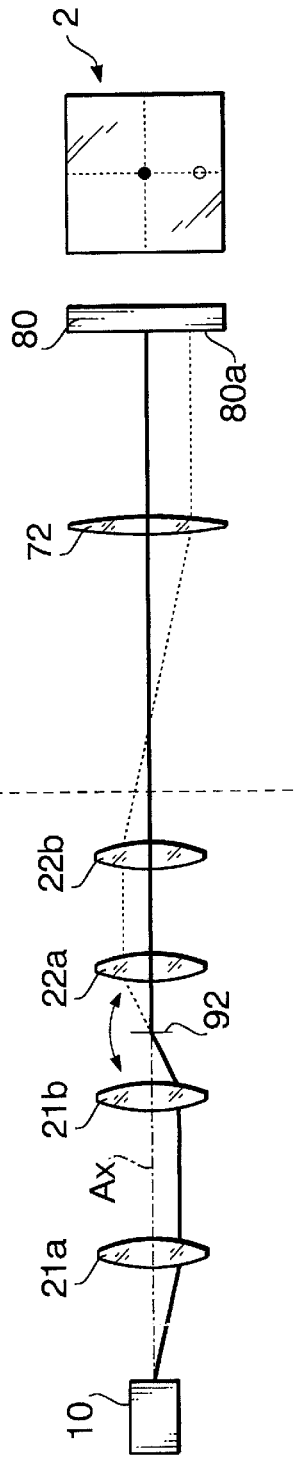

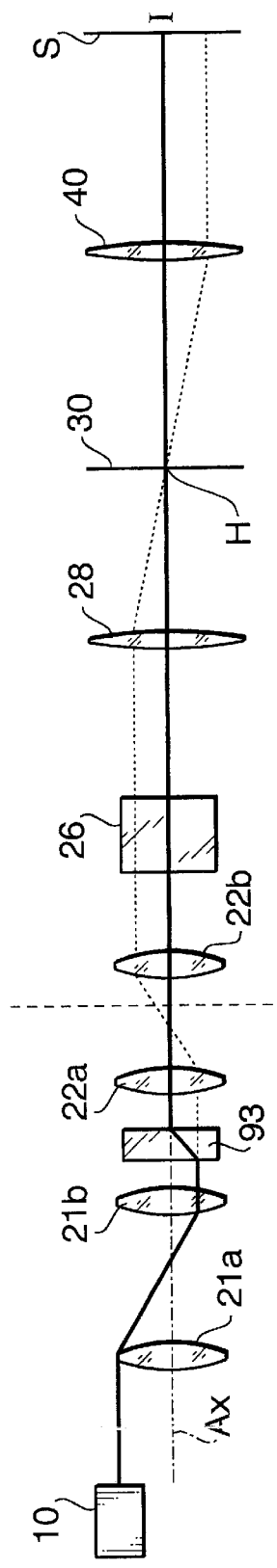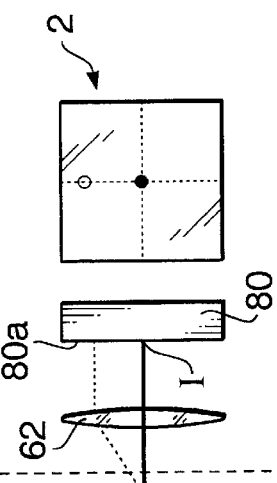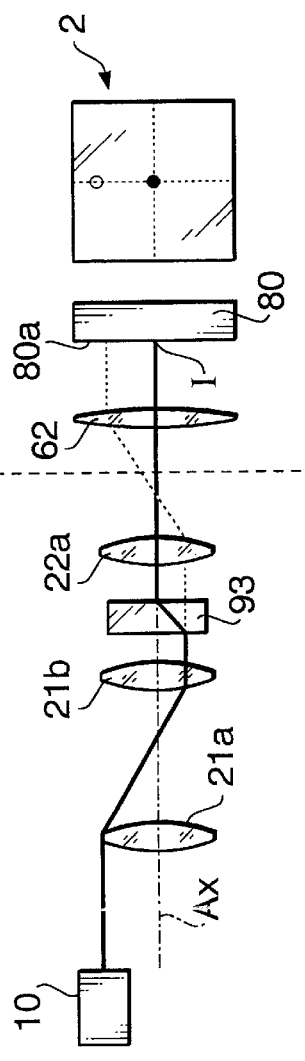

LASER IMAGING APPARATUS

BACKGROUND OF THE INVENTION

The present invention relates to a laser imaging apparatus which emits a modulated scanning beam to form an image pattern on a surface.

Conventionally, a laser imaging apparatus such as a direct imager of a laser photo plotter has been used for forming a circuit pattern or the like when a printed circuit board or a semiconductor element is manufactured. In such a laser imaging apparatus, a gas laser is typically employed as a laser source. The emitted laser beam is introduced into a modulator using a relaying optical system or the like. The modulator ON/OFF modulates the incident laser beam. Then, the modulated laser beam is deflected, by a deflector such as a polygonal mirror having a plurality of deflecting surfaces, thereby scanning the beam within a predetermined angular range. The deflected (i.e., scanning) laser beam is incident on an imaging optical system, such as an fθ lens, which converges the beam on a photoconductive surface to form a scanning beam spot thereon so that a circuit pattern or the like is formed without a mask.

In such an imaging device, due to the deterioration of the sealed gas, the laser source should be exchanged. When the laser source is exchanged, the position and orientation of the laser beam are precisely adjusted so that the newly implemented laser source emits a beam precisely along the optical axis of the optical system.

Conventionally, in order to adjust the position and orientation of the laser beam, a plurality of targets, such as plates respectively formed with pinholes are provided in a light passage. Further, beam benders are provided, and the alignment of the laser beam with respect to the optical axis is achieved by adjusting the orientation of each of the beam benders so that the laser beam passes through each of the pinholes.

Each of the pinholes, however, is formed to have a relatively large diameter with respect to the diameter of the laser beam passes therethrough so that not only the center but also the peripheral portion of the Gaussian distribution thereof passes therethrough when the apparatus is used for forming the image. Therefore, in such a conventional alignment mechanism, alignment cannot be done at high precision.

Further, the alignment operation using the pinholes generally takes relatively long time, since the angle of each of the beam benders should be adjusted with confirming the position of the beam using a sensor or a fluorescing plate which may be located in the vicinity of every target position. Furthermore, the beam benders have too much degree of freedom in their changeable angles, which causes the adjustment operation to take longer period since the combination of the angles of the beam benders should be appropriately selected.

As the alignment of the laser beam with respect to the optical axis is required each time when the laser source is exchanged, there has been a demand for an apparatus with which the adjustment can be performed easily.

SUMMARY OF THE INVENTION

It is therefore an object of the invention to provide an improved laser imaging apparatus with which the alignment of the laser beam with respect to the optical axis can be done relatively easily at high accuracy.

For the above object, according to the present invention, there is provided a laser imaging apparatus which is provided with a laser source that emits a laser beam, a relaying optical system including a plurality of lens elements, the relaying optical systems relaying the laser beam emitted by the laser source, a deflector having at least one deflecting surface that deflects the laser beam relayed by the relaying optical system, an imaging optical system that converges the laser beam deflected by the at least one deflecting surface to form a beam spot on a surface to be scanned, an optical axis of the relaying optical system and an optical axis of the imaging optical system intersecting at a deflection reference point which is located in the vicinity of the at least one deflecting surface. The laser imaging apparatus is further provided with a first adjusting system that compensates for an inclination error of the laser beam incident on the at least one deflecting surface, the first adjusting system being provided in the relaying optical system, and a second adjusting system that compensates for a positional error of the laser beam incident on the at least one deflecting surface. The second adjusting system is provided in the relaying optical system.

With this configuration, the inclination and deviation of the laser beam with respect to the optical axis can be adjusted independently from each other, and thus can be adjusted relatively easily.

Optionally, a rear focal point of the relaying optical system may coincide with the deflection reference point, and a rear focal point of the imaging optical system may be on the surface to be scanned.

Further optionally, a beam emitting point of the laser source may be located on a front focal point of the relaying optical system.

Still optionally, the first adjusting system may include an optical system which deflects the laser beam at a point, within the relaying optical system, which is conjugate with the deflection reference point, a deflection direction being adjustable.

In a particular case, the first adjusting system may include an optical system which deviates the laser beam at a point, within the relaying optical system, which is conjugate with the rear focal point of the imaging optical system or in the close vicinity thereof, a deviation amount being adjustable.

Yet optionally, the laser imaging apparatus may include a beam position detector that detects an inclination error of a principal ray of the laser beam incident on the at least one deflection surface, with respect to the optical axis of the relaying optical system. The beam position detector may be located at one of a position conjugate with the rear focal point of the imaging optical system and in the vicinity thereof, and a position equivalent to the rear focal point of the imaging optical system and in the vicinity thereof.

In particular, the beam position detector may be located on a downstream side of the first adjusting system.

The laser imaging apparatus may further include a splitting member that splits the laser beam. The splitting member may be located at a position, within the relaying optical system, conjugate with the deflection reference position or in the vicinity thereof, a relaying lens, the relaying lens being arranged such that a front focal point thereof coincides with a rear focal point of an optical system located on an upstream side of the splitting member, and a beam position detector that receives the laser beam split by the splitting member and passed through the relaying lens, the beam position detector detecting a position at which the laser beam enters.

In this case, the splitting member is located on a rear side of the first adjusting system.

The second adjusting system includes an optical system that deflects the laser beam at a position, within the relaying optical system, which is conjugate with the rear focal point of the imaging optical system, a deflection direction being adjustable.

In an embodiment, the second adjusting system includes an optical system which deviates the laser beam at a point, within the relaying optical system, which is conjugate with the rear focal point of the imaging optical system or in the close vicinity thereof, a deviation amount being adjustable.

Further, the laser imaging apparatus may include a beam position detector that detects a positional error of a principal ray of the laser beam incident on the at least one deflection surface with respect to the optical axis of the relaying optical system as a deviation from the optical axis of the relaying optical system, the beam position detector being located at one of a position conjugate with the rear focal point of the imaging optical system and in the vicinity thereof, and a position equivalent to the rear focal point of the imaging optical system and in the vicinity thereof.

In this case, the beam position detector may be located on a downstream side of the second adjusting system.

The laser imaging apparatus may include a splitting member that splits the laser beam, the splitting member being located at a position, within the relaying optical system, conjugate with the rear focal point of the imaging optical system or in the vicinity thereof a relaying lens, the relaying lens being arranged such that a front focal point thereof coincides with a rear focal point of an optical system located on an upstream side of the splitting member, and a beam position detector that receives the laser beam split by the splitting member and passed through the relaying lens, the beam position detector detecting a position at which the laser beam enters.

Further, the splitting member may be located on a rear side of the second adjusting system.

Optionally, the relaying optical system may include a modulator that ON/OFF modulates the laser beam passing therethrough, and wherein the first and second adjusting systems are located on the front side of the modulator.

In such a case, the relaying optical system may include a collimating lens that collimates the laser beam emitted from the modulator.

Still optionally, the relaying optical system may include at least one reducing optical system that reduces a diameter of the laser beam.

According to another aspect of the invention, there is provided a laser imaging apparatus which is provided with a laser source that emits a laser beam, a relaying optical system including a plurality of lens elements, the relaying optical systems relaying the laser beam emitted by the laser source, a deflector that deflects the laser beam emitted by the laser source and relayed by the relaying optical system to scan, an imaging optical system that converges the laser beam deflected by the deflector to form a scanning beam spot on a surface to be scanned, a first adjusting system that compensates for an inclination error of the laser beam incident on the deflector, the first adjusting system being provided in the relaying optical system, and a second adjusting system that compensates for a positional error of the laser beam incident on the deflector, the second adjusting system being provided in the relaying optical system. In this case, compensation of the first adjusting system and compensation of the second adjusting system do not affect to each other.

BRIEF DESCRIPTION OF THE ACCOMPANYING DRAWINGS

FIG. 1 schematically shows an optical constitution of a laser imaging apparatus according to an embodiment of the invention;

FIG. 2A shows a developed passage of a laser beam from a laser source to a surface to be scanned when a principal ray of the laser beam incident on a deflecting surface of a polygonal mirror is inclined with respect to an optical axis;

FIG. 2B shows a developed passage of a laser beam from a laser source to a sensor via a first relaying optical system when a principal ray of the laser beam incident on a deflecting surface of a polygonal mirror is inclined with respect to an optical axis;

Figure 4:
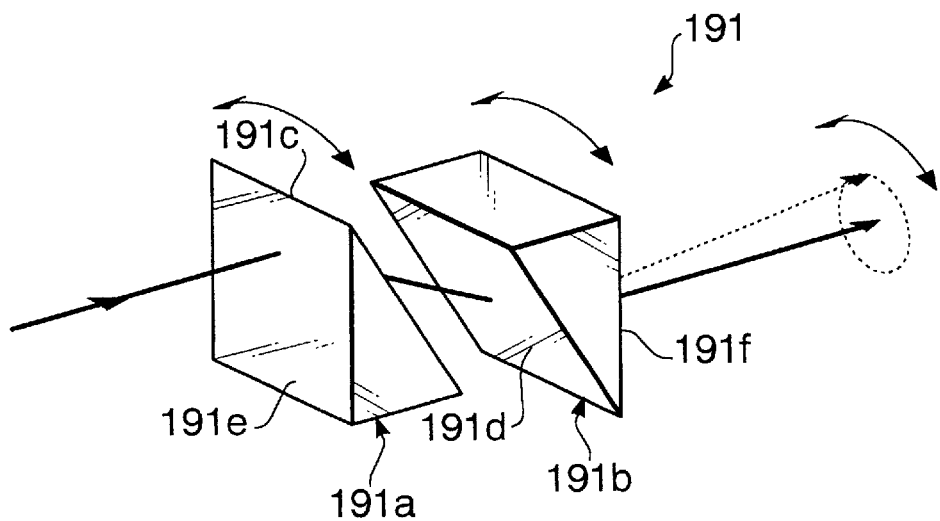
Figure 5:
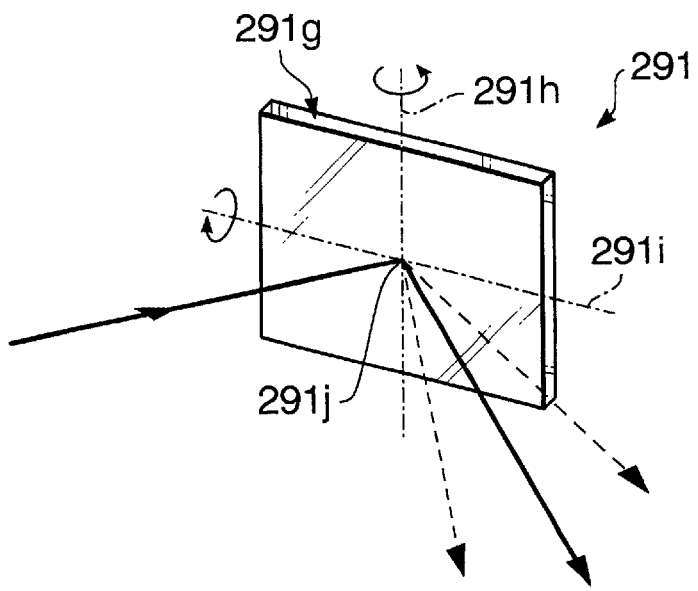
Figure 7A:
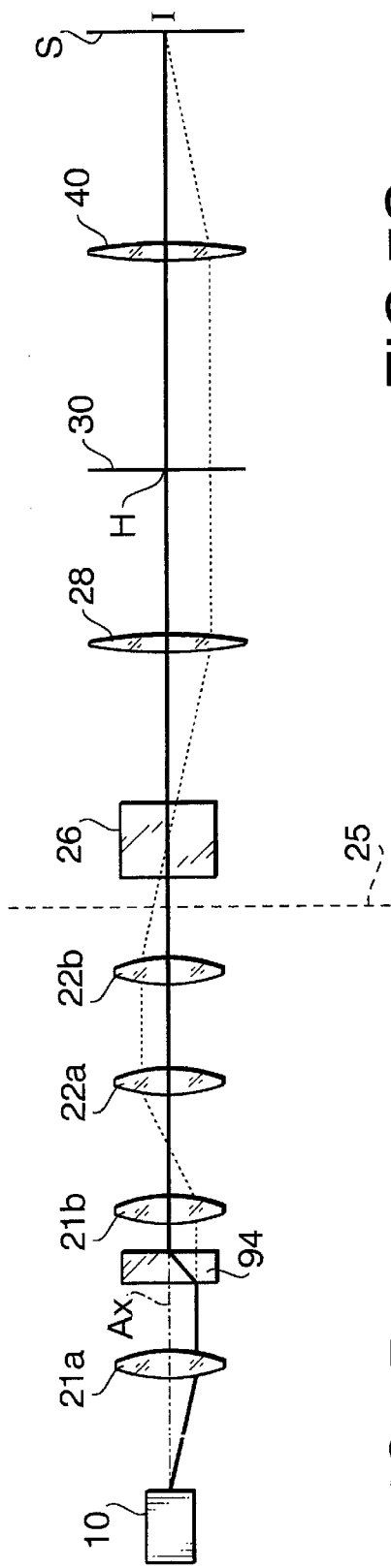
Figure 7C:
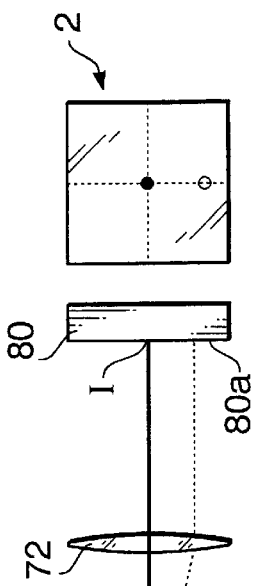
Figure 7B:
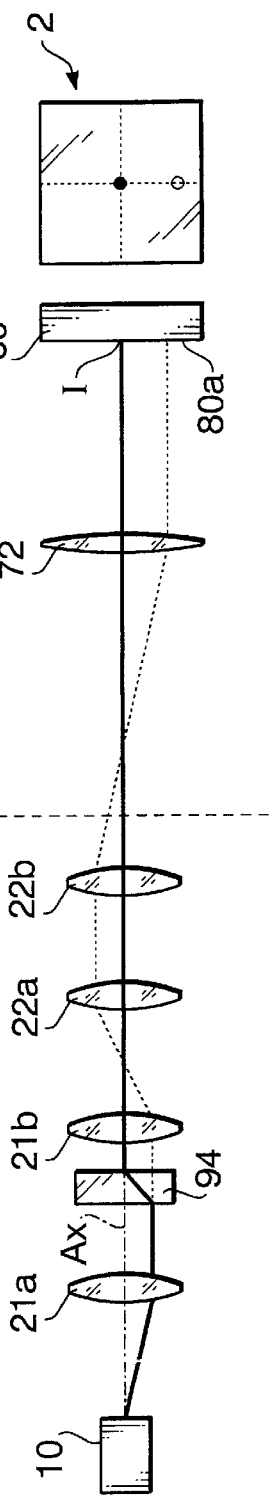
Figure 8:
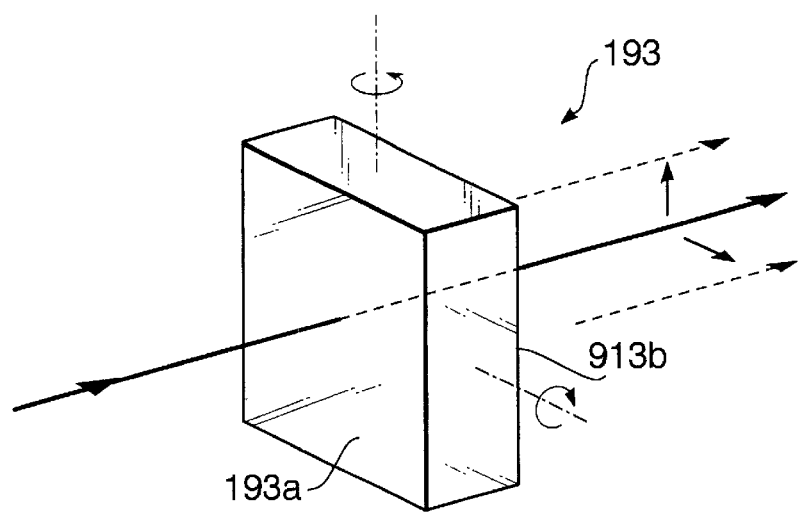
Figure 9:
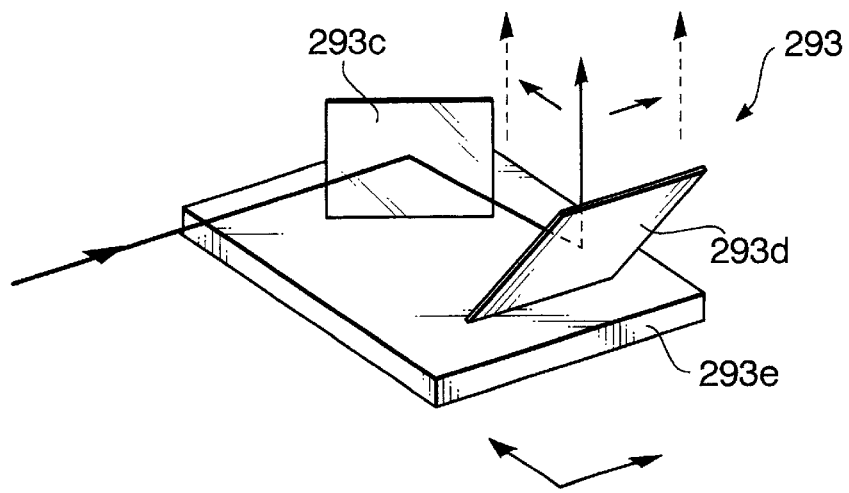

FIG. 2C schematically shows a screen of a monitor;

FIG. 3A shows a developed passage of a laser beam from a laser source to a surface to be scanned when a principal ray of the laser beam incident on a deflecting surface of a polygonal mirror is shifted with respect to an optical axis;

FIG. 3B shows a developed passage of a laser beam from a laser source to a sensor via a first relaying optical system when a principal ray of the laser beam incident on a deflecting surface of a polygonal mirror is shifted with respect to an optical axis;

FIG. 3C shows a screen of the monitor;

FIG. 4 is a perspective view of an example of the beam position adjusting system according to a first embodiment;

FIG. 5 is a perspective view of another example of a beam position adjusting system according to the first embodiment;

FIG. 6A shows a developed passage of a laser beam from a laser source to a surface to be scanned when a principal ray of the laser beam incident on a deflecting surface of a polygonal mirror is inclined with respect to an optical axis;

FIG. 6B shows a developed passage of a laser beam from a laser source to a sensor via a first relaying optical system when a principal ray of the laser beam incident on a deflecting surface of a polygonal mirror is inclined with respect to an optical axis;

FIG. 6C shows a screen of the display;

FIG. 7A shows a developed passage of a laser beam from a laser source to a surface to be scanned when a principal ray of the laser beam incident on a deflecting surface of a polygonal mirror is shifted with respect to an optical axis;

FIG. 7B shows a developed passage of a laser beam from a laser source to a sensor via a first relaying optical system when a principal ray of the laser beam incident on a deflecting surface of a polygonal mirror is shifted with respect to an optical axis;

FIG. 7C shows a screen of the monitor;

FIG. 8 is a perspective view of an example of a beam position adjusting system according to a second embodiment; and FIG. 9 is a perspective view of another example of the beam position adjusting system according to the second embodiment.

DESCRIPTION OF THE EMBODIMENTS

Hereinafter, laser imaging apparatus according to the present invention will be described with reference to the accompanying drawings.

First Embodiment

Figure 1:
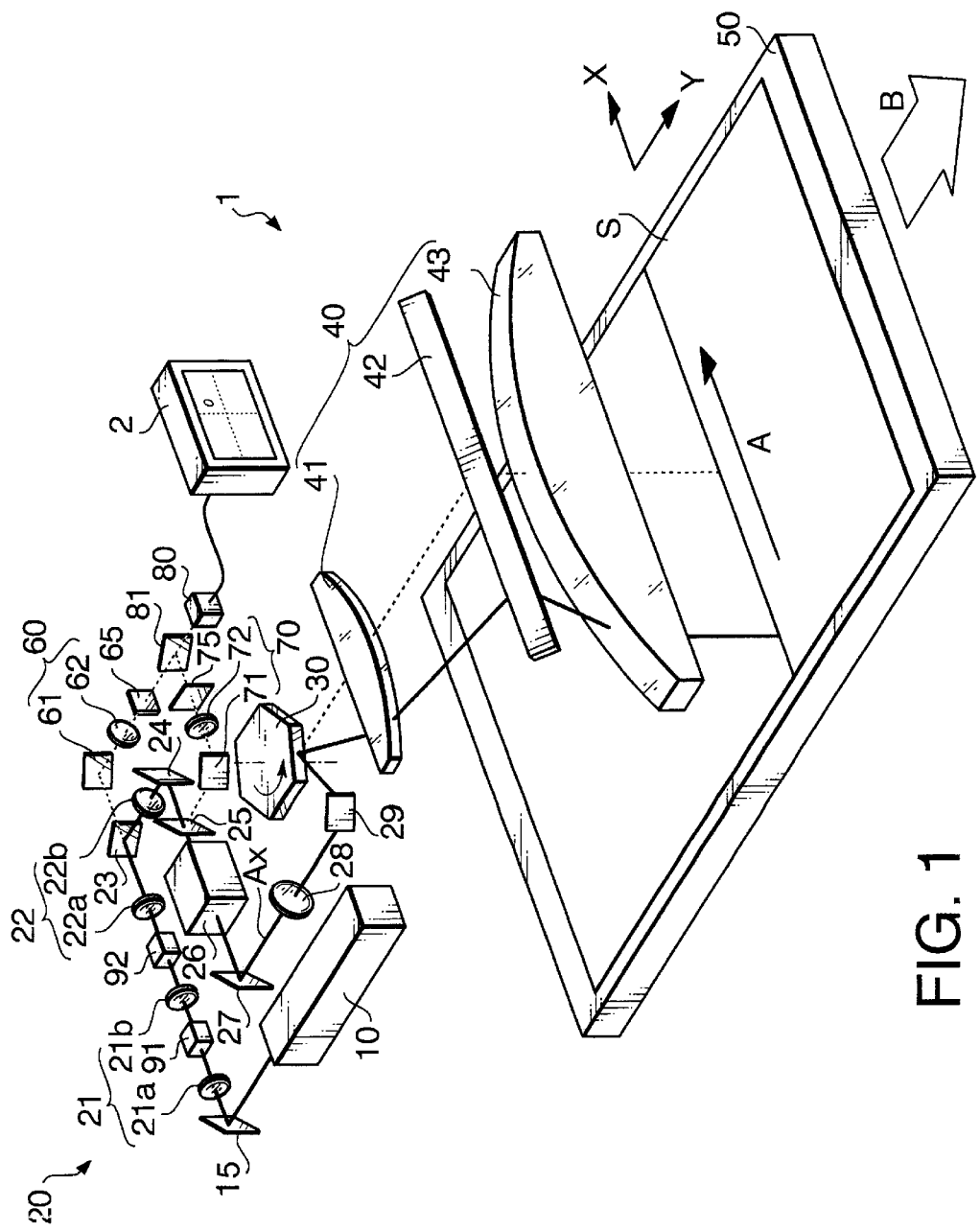

FIG. 1 schematically shows an optical structure of a laser imaging apparatus 1 according to an embodiment of the invention.

The laser imaging apparatus 1 is for forming an image of a circuit pattern or the like directly on a surface S of the substrate 50. The laser imaging apparatus 1 includes a laser source 10, a modulating optical system 20, a polygonal mirror 30, an imaging optical system 40. Further, the laser imaging apparatus 1 is provided with first and second relaying optical systems 60 and 70, a beam position detector 80 for detecting a position of the laser beam with respect to an optical axis Ax of the modulating optical system 20. Furthermore, the laser imaging apparatus 1 includes first and second beam position adjusting systems 91 and 92, which are used for adjusting the position of the laser beam.

The laser source 10 is a gas laser source, which uses, for example, Argon gas or mixture of Helium-Neon gas, emits a laser beam which is a slightly diverging beam. The laser beam emitted by the laser source 10 is incident on a beam bender 15, which reflects the laser beam toward the modulating optical system 20.

The modulating optical system 20 is configured to ON/OFF modulate the laser beam emitted by the laser source 10.

Specifically, the modulating optical system 20 includes first and second reduction optical systems 21 and 22, which reduce the diameter of the laser beam, an acousto-optic modulator (AOM) 26, which ON/OFF modulates the laser beam passed through the first and second reduction optical systems 21 and 22, and a collimating lens 28 which collimates the laser beam emerged from the AOM 26.

The first reduction optical system 21 includes first and second lens groups 21a and 21b. The first lens group 21a has a positive power, and is arranged such that the front focal point thereof coincides with a light emitting point of the laser source 10. The second lens group 21b also has a positive power, and is arranged such that the front focal point thereof coincides with the rear focal point of the first lens group 21a. It should be noted that the rear focal point of the first lens group 21a, i.e. the front focal point of the second lens group 21b, is located closer to the second lens group 21b than to the first lens group 21a. Accordingly, the diameter of the laser beam is reduced as the laser beam passed through the first and second lens groups 21a and 21b.

Between the first and second lens groups 21a and 21b, a first beam position adjusting system 91 is inserted, which will be described in detail later.

The laser beam passed through the first reduction optical system 21, i.e., the first and second lens groups 21a and 21b, is incident on the second reduction optical system 22.

Between the second lens group 21b and the second reduction optical system 22, a second beam position adjuster 92 is provided, which will also be described in detail later.

The second reduction optical system 22 includes third and fourth lens groups 22a and 22b. The third lens group 22a has a positive power, and is arranged such that the front focal point thereof coincides with the rear focal point of the second lens group 21b. The laser beam passed through the third lens group 22a is incident on a half mirror 23, which allows a part of the incident beam to pass therethrough and reflects the remainder of the incident beam toward the fourth lens group 22b.

The fourth lens group 22b also has a positive power, and is arranged such that the front focal point thereof coincides with the rear focal point of the third lens group 22a. The rear focal point of the third lens group 22a, i.e. the front focal point of the fourth lens group 22b, is located closer to the fourth lens group 22b than to the third lens group 22a. Accordingly, the diameter of the laser beam is reduced as the laser beam passed through the third and fourth lens groups 22a and 22b.

The laser beam passed through the fourth lens group 22b is incident on a beam bender 24, which reflects the laser beam toward a half mirror 25, which allows a part of the incident beam to pass therethrough and reflects the remainder of the laser beam toward another beam bender 71.

The beam passed through the half mirror 23 and the beam reflected by the half mirror 25 are directed to a first and second relaying optical systems 60 and 70, respectively, and are used for detecting a displacement of the laser source 10, which will be described in detail later.

The laser beam passed through the half mirror 25 passes through the AOM 26, which ON/OFF modulates the laser beam passing therethrough in accordance with image data representing an image to be formed on the surface S.

The laser beam ON/OFF modulated by the AOM 26 is reflected by a beam bender 27 and is directed to the collimating lens 28. The beam collimated by the collimating lens 28 is incident on a beam bender 29, which reflects the laser beam toward the polygonal mirror 30.

The polygonal mirror 30 has a plurality of reflecting surfaces and is rotated about the central axis thereof at a predetermined angular speed. The laser beam reflected by the beam bender 29 is reflected by the reflecting surfaces of the polygonal mirror 30. Thus, the laser beam repeatedly scanning within a predetermined angular range as the polygonal mirror 30 rotates.

The deflected laser beam, i.e., the scanning laser beam is incident on the imaging optical system 40. The intersection point of the optical axis Ax of the modulating optical system 20 and the optical axis of the imaging optical system 40, which is located in the vicinity of a deflecting surface at which the laser beam is deflected, will be referred to as a deflecting reference point.

The imaging optical system 40 converges the laser beam on the surface S of the substrate 50 to form a beam spot thereon. It should be noted that the rear focal point of the imaging optical system is located on the surface S of the substrate 50.

The imaging optical system 40 includes an fθ lens 41, an elongated mirror 42, and a condenser lens 43. It should be noted that the laser emitting point of the laser source 10, the rear focal point of the second lens group 21b, and the rear focal point of the fourth lens group 22b are conjugate with the rear focal point of the imaging optical system 40. Further, the rear focal point of the first lens group 21a and the rear focal point of the third lens group 22a are conjugate with the deflecting reference point.

The laser beam deflected by the polygonal mirror 30 and passed through the fθ lens 41 is reflected by the elongated mirror 42, passes through the condenser lens 43, and is incident on the surface S. The laser beam passes through the condenser lens 43 is incident on the surface S along a direction substantially perpendicular to the surface S. As the polygonal mirror 30 rotates at a constant angular speed, the beam spot formed on the surface S moves in a direction indicated by arrow A in FIG. 1 at a constant speed.

The direction X corresponding to the direction indicated by arrow A in FIG. 1, in which the beam spot moves, will be referred to as a main scanning direction.

The substrate 50 is fixed on a table (not shown), which is placed on rails (not shown) that are mounted on a base of the laser imaging apparatus 1. Using an actuator (not shown), the table is moved, at a constant speed, along the rails, in a direction indicated by arrow B in FIG. 1 with the substrate 50 thereon. While the beam spot moves in the main scanning direction X, the substrate 50 is moved in the direction indicated by arrow B. The direction Y corresponding to the direction indicated by arrow B in FIG. 1, in which the substrate 50 moves, will be referred to as an auxiliary scanning direction.

With the above main scanning of the beam spot and the auxiliary scanning movement of the substrate, the surface S is two-dimensionally exposed to the ON/OFF modulated laser beam, and a two-dimensional image is formed thereon.

As described above, the laser imaging apparatus 1 utilizes the gas laser as the laser source 10. Due to the deterioration of the sealed gas, the laser source 10 should be exchanged periodically. When a new laser source 10 is installed in the laser imaging apparatus 1, the principal ray of the laser beam emitted from the new laser source 10 may not coincide with the optical axis Ax of the modulating optical system 20 but shifts and/or inclines with respect to the optical axis Ax due to a positional error or the like. In such a case, the laser beam impinges on the deflecting surface of the polygonal mirror 30 with its principal ray being inclined or shifted from the optical axis Ax.

According to the first embodiment, the shift and/or inclination of the laser beam emitted by the laser source 10 with respect to the optical axis Ax is detected using a beam position detector 80 and the first and second relaying optical systems 60 and 70. Then, using the beam position adjusting systems 91 and 92, the shift and/or inclination of the laser beam is compensated so that the laser beam travels along the optical axis Ax.

Specifically, the beam position detector 80 detects, in cooperation with the first relaying optical system 60, a shifting amount of the principal ray of the laser beam with respect an optical axis Ax of the modulating optical system 20 at a first reference position that is one of positions conjugate with the surface S to be scanned.

Further, the beam position detector 80 detects, in cooperation with the second relaying optical system 70, a shifting amount of the principal ray of the laser beam with respect an optical axis Ax at a second reference position that is one of positions conjugate with an reflecting surface of the polygonal mirror 30.

The first relaying optical system 60 includes a beam bender 61, a relaying lens 62 having a positive power, a shutter 65, and a half mirror 81.

The laser beam passed through the half mirror 23 is reflected by the beam bender 61, passes through the relaying lens 62, passes through the shutter 65 when it is open, and is incident on the half mirror 81. A part of the laser beam incident on the half mirror 81 passes therethrough and is incident on the beam position detector 80.

The optical axis of third lens group 22a that intersects the half mirror 23 is bent by the beam bender 61 so that it coincides with the optical axis of the relaying lens 62. The optical axis of the relaying lens 62 intersects the shutter 65, the half mirror 81, and finally intersects the center of the beam position detector 80.

The relaying lens 62 is arranged such that the front focal point thereof coincides with the rear focal point of the third lens group 22a, and the rear focal point of the relaying lens 62 is located on the image receiving area of the beam position detector 80. Thus, the image receiving area of the beam position detector 80 is conjugate with the rear focal point of the second lens group 21b with respect to the relaying lens 62, and is located at a position optically equivalent to the rear focal point of the imaging optical system 40.

The second relaying optical system 70 includes a beam bender 71, a relaying lens 72 having a positive power, a shutter 75, and the half mirror 81.

The laser beam reflected by the half mirror 25 is reflected by the beam bender 71 toward the relaying lens 72, and passes through the relaying lens 72. When the shutter 75 is open, the laser beam passes through the shutter 75, reflected by the half mirror 81 and impinges on the beam position detector 80.

The optical axis of the fourth lens group 22b coincides with the optical axis of the relaying lens 72 after being bent by the beam bender 71. The optical axis of the relaying lens 72 intersects the shutter 75, which is for shielding the light beam, is bent by the half mirror 81 such that it coincides with the optical axis of the relaying lens 62, and intersects the center of the beam position detector 80.

The relaying lens 72 is arranged such that its front focal point coincides with the rear focal point of the fourth lens group 22b, and the rear focal point of the relaying lens 72 is located on the image receiving area of the beam position detector 80. Thus, the image receiving area of the beam position detector 80 is conjugate with the rear focal point of the third lens group 22a with respect to the relaying lens 72, and is at a position optically equivalent to the deflecting reference point.

The beam position detector 80 has a light sensing device, e.g., a CCD (Charge Coupled Device), and converts the received image of the laser beam into electronic signals to generate an image signal. As described above, the beam position detector 80 is arranged such that each of the optical axis of the first and second relaying lenses 60 and 70 intersects the center of the image receiving area thereof. The beam position detector 80 outputs the image signal to a monitor device 2 which displays a bright spot indicative of the beam incident on the image receiving area.

On an image displaying screen of the monitor 2, two crossing lines are superimposed. The two lines divides the screen in the vertical and horizontal directions, respectively. Preferably, the two lines intersect with each other at the center thereof, and the intersection point of the two lines may be adjusted to indicate the center of the image receiving area of the beam position detector 80, i.e., the position of the optical axes of the first and second relaying optical systems 60 and 70.

With this configuration, a position of the bright spot displayed on the monitor 2 in relation to the intersection point of the superimposed lines represents the deviation of the laser beam with respect to the optical axes of the first and second relaying optical systems 60 and 70.

It should be noted that the beam position detector 80 is in conjugation with the beam emitting point of the laser source 10 with respect to the relaying lens 62. If the first relaying optical system 60 is used (i.e., the shutter 65 is opened) and the second relaying optical system 70 is not used (i.e., the shutter 75 is closed), the beam position detector 80 is not sensitive with respect to the inclination error of the laser beam emitted from the laser source 10, i.e., the deviation of the laser beam at the deflecting reference point.

Further, the beam position detector 80 is in conjugation with the rear focal point of the first lens group 21a with respect to the relaying lens 72. In this regard, if the first relaying optical system 60 is not used (i.e., the shutter 65 is closed) and the second relaying optical system 70 is used (i.e., the shutter 75 is opened), the beam position detector 80 is not sensitive with respect to the error of the position where the laser beam is emitted from the laser source 10, i.e., the inclination error of the laser beam at the deflecting reference point.

Thus, the beam position detector 80 can separately detect the inclination error and the positional error of the laser beam at the deflection reference point.

In order to compensate for the positional error and/or inclination error thus detected, the first and second beam position adjusting systems 91 and 92 are used.

The first beam position adjusting system 91 is arranged between the first and second lens groups 21a and 21b, and the second beam position adjusting system 92 is arranged between the second lens group 21b and the second reduction optical system 22.

Specifically, the beam position adjusting system 91 is located at the first reference position which is one of the positions conjugate with the surface to be scanned, and the beam position adjusting system 92 is located at the second reference position which is one of the positions conjugate with reflecting surface of the polygonal mirror.

FIGS. 2A and 2B show developed paths of the laser beam in the laser imaging apparatus 1 when the laser source 10 is implemented in the apparatus such that the principal ray of the laser beam incident on the deflecting surface of the polygonal mirror 30 is inclined with respect to the optical axis Ax of the modulating optical system 20 (in other words, the laser source is shifted with respect to the optical axis Ax).

FIG. 2A shows the developed path of the laser beam from the laser source 10 to the scanning surface S when the deflecting surface of the polygonal mirror 30 deflects the optical axis Ax of the modulating optical system 20 such that it coincides with the optical axis of the imaging optical system 40. FIG. 2B shows the developed path of the laser beam from the laser source 10 to the beam position detector 80 via the relaying optical system 60. When the laser beam passed through the first relaying optical system 60 is detected, the shutter 65 is opened, and the shutter 75 of the second relaying optical system 70 is closed. In this regard, in FIG. 2B, the shutter 65, the beam bender 61 and the half mirror 81 are omitted. In each of FIGS. 2A and 2B, the thick solid and broken lines represent the paths of the laser beam with and without an adjustment of the laser beam position using the beam position adjusting system 91, respectively. On an upstream side of the beam position adjuster 91, the solid line overlaps the broken line.

If no adjustment by the beam position adjuster 91 is done (which is represented by broken lines), the laser beam emitted from the laser source 10 is refracted by the first lens group 21a and passes the rear focal point of the first lens group 21a (i.e., the front focal point of the second lens groups 21b), as indicated by the broken lines in FIG. 2A. Then, the laser beam is refracted by the second lens group 21b to proceed in parallel with the optical axis Ax. The laser beam is then refracted by the third lens group 22a and passes the rear focal point of the third lens group 22a (i.e., the front focal point of the fourth lens group 22b). The laser beam is then refracted by the fourth lens group 22b to proceed in parallel with the optical axis Ax and is incident on the AOM 26. The laser beam is modulated by the AOM 26, and refracted by the collimating lens 28. The laser beam then passes the deflection reference point H on the reflecting surface of the polygonal mirror 30. As shown in FIG. 2A, the principal ray of the laser beam directed to the deflection reference point H is inclined with respect to the optical axis Ax.

The laser beam reflected on the reflecting surface of the polygonal mirror 30 is incident on the imaging optical system 40, which refracts the laser beam so as to proceed in parallel with the optical axis Ax. Since the laser beam reflected by the reflecting surface of the polygonal mirror 30 is inclined with respect to the optical axis Ax, the beam impinges on the scanning surface S at a position shifted from the rear focal point I of the imaging optical surface 40.

FIG. 2B shows the path of the beam directed to the beam position detector 80 when the laser source 10 is shifted from the optical axis Ax, and the broken line represents an optical path when the beam position is not adjusted using the beam position adjusting system 91.

As shown by broken lines in FIG. 2B, the laser beam passed through the half mirror 23 is refracted by the relaying lens 62 to proceed in parallel with the optical axis Ax, and impinges on the image receiving area 80a of the beam position detector 80 to form a beam spot thereon.

FIG. 2C schematically shows an image display screen of the monitor 2 which receives the image signal output by the beam position detector 80 and displays a bright spot (which is represented by a white circle in FIG. 2C). The rectangular shape of the screen corresponds to a rectangular shape of the image receiving area 80a, and the center of the screen (which is indicated by a black circle, or an intersection point of two broken lines in FIG. 2C) corresponds to the position of the optical axis Ax. Therefore, the position of the bright spot on the screen indicates a position of the beam spot on image receiving area 80a.

It should be noted that direction and distance of the bright spot with respect to the center of the screen represent direction and deviation amount of the laser beam emitted by the laser source 10, respectively.

In the above case, with use of the first beam position adjusting system 91, the bright spot can be moved to locate on the intersection point of the superimposed lines, i.e., the optical path is changed such that the laser beam on the downstream of the first beam position adjuster 91 proceeds along the optical axis Ax.

Specifically, by the first beam position adjusting system 91, which is located at the rear focal point of the first lens group 21a, the laser beam is deflected so as to proceed along the optical axis Ax as indicated by solid lines in FIGS. 2A and 2B.

With this configuration, the laser beam proceeds along the optical axis Ax and accordingly is incident on the deflection reference point H along the optical path Ax. Further, the beam is incident on the image receiving surface 80a along the optical axis Ax. In such a case, the bright beam spot is displayed at the position indicated by black circle in FIG. 2C.

In the above-described embodiment, the beam position adjusting system 91 is provided at the rear focal point of the first lens group 21a. The beam position adjusting system, however, maybe provided to other positions that is in conjugation with the rear focal point of the first lens group 21a, or in conjugation with the deflection reference point H.

In a particular case, the first beam position adjusting system 91 may be positioned at the rear focal point of the third lens group 22a. In such a case, it is preferable that the half mirror 23 is located at the beam emerging side of the first beam position adjuster 91 so that the correction of the beam position by the beam position adjuster 91 can be observed by the beam position detector 80.

FIGS. 3A and 3B show developed paths of the laser beam in the laser imaging apparatus 1 when the laser source 10 is implemented in the apparatus 1 such that the principal ray of the laser beam incident on the deflecting surface of the polygonal mirror 30 deviates (i.e., is shifted) with respect to the optical axis Ax of the modulating optical system 20 (in other words, the laser source is inclined with respect to the optical axis Ax).

FIG. 3A shows the developed path of the laser beam from the laser source 10 to the surface S when the deflecting surface of the polygonal mirror 30 deflects the optical axis Ax of the modulating optical system 20 such that it coincides with the optical axis of the imaging optical system 40. FIG. 3B shows the developed path of the laser beam from the laser source 10 to the beam position detector 80 via the relaying optical system 70. When the laser beam passed through the second relaying optical system 70 is detected, the shutter 65 is closed, and the shutter 75 of the second relaying optical system 70 is opened. In this regard, in FIG. 3B, the shutter 75, the beam bender 71 and the half mirror 81 are omitted. In each of FIGS. 3A and 3B, the thick solid and broken lines represent the paths of the laser beam with and without an adjustment of the laser beam position using the beam position adjuster 92, respectively. On an upstream side of the beam position adjuster 92, the solid line overlaps the broken line.

If no adjustment by the beam position adjusting system 92 is done, the laser beam emitted from the laser source 10 is refracted by the first lens group 21a to proceed in parallel with the optical axis Ax, and is indicated on the second lens group 21b. Then, the laser beam is refracted by the second lens group 21b and passes the rear focal point of the second lens group 21b (i.e., the front focal point of the third lens group 22a). The laser beam is then incident on the third lens group 22a, which refracts the beam to proceed in parallel with the optical axis Ax. The laser beam is then incident on the fourth lens group 22b, which refracts the beam the AOM 26. The laser beam is modulated by the AOM 26, and refracted by the collimating lens 28. The laser beam emerged from the collimating lens 28 is incident, along a direction parallel to the optical axis Ax, on the deflection reference point H on the reflecting surface of the polygonal mirror 30.

The laser beam reflected on the reflecting surface of the polygonal mirror 30 proceeds along a direction parallel to the optical axis Ax, and is incident on the imaging optical system 40, which refracts the laser beam so as to be directed to the rear focal point I on the surface S. Since the laser beam reflected by the reflecting surface of the polygonal mirror 30 proceeds in parallel with the optical axis Ax, the beam impinges on the surface S is inclined with respect to the optical axis Ax.

FIG. 3B shows the path of the beam directed to the beam position detector 80 when the laser source 10 is inclined with respect to the optical axis Ax, and the broken line indicates an optical path when the beam position is not adjusted using the beam position adjuster 92.

As shown by broken lines in FIG. 3B, the laser beam reflected by the half mirror 25 is refracted by the relaying lens 72 to proceed in parallel with the optical axis Ax, and impinges on the image receiving area 80a of the beam position detector 80 to form a beam spot thereon.

FIG. 3C schematically shows a image display screen of the monitor 2 which receives the image signal output by the beam position detector 80 and displays a bright spot (which is represented by a white circle in FIG. 3C). The position of the bright spot on the screen indicates a position of the beam spot on image receiving area 80a.

It should be noted that direction and distance of the bright spot with respect to the center of the screen of the monitor device 2 represent direction and inclination amount of the laser beam emitted by the laser source 10, respectively.

In the above case, with use of the second beam position adjusting system 92, the bright spot can be moved to locate on the intersection point of the superimposed lines, i.e., the optical path is changed such that the laser beam on the downstream of the first beam position adjuster 91 proceeds along the optical axis Ax.

Specifically, by the second beam position adjusting system 92 which is located at the rear focal point of the second lens group 21b, the laser beam is deflected so as to proceed along the optical axis Ax as indicated by solid lines in FIGS. 3A and 3B.

With this configuration, the laser beam proceeds along the optical axis Ax, and accordingly, is incident on the deflection reference point H along the optical path Ax. Further, the beam is incident on the image receiving surface 80a along the optical axis Ax. In such a case, the bright beam spot is displayed at the position indicated by black circle in FIG. 3C.

In the embodiment, the beam position adjuster 92 is provided at the rear focal point of the second lens group 21b. The beam position adjuster 92, however, may be provided to other positions that is in conjugation with the rear focal point of the second lens group 21b.

In other words, the beam position adjuster 92 may be provided at a position which is conjugate with the rear focal point I of the imaging optical system 40. In such a case, it is preferable that the half mirror 25 is provided at the beam ejecting side of the beam position adjuster 92 so that the correction of the beam position by the beam position adjuster 92 can be observed by the beam position detector 80.

With this configuration, since the light source and the beam position detector have a conjugate relationship, even if the beam emitted by the light source is inclined with respect to the optical axis, it does not affect the detection and adjustment of the deviation (shift) of the light source. Further, since the beam position detector and the rear focal point of the second lens group 21b have a conjugate relationship, even the position of the light source is shifted with respect to the optical axis, it does not affect the detection and adjustment of the inclination of the beam.

As described above, the inclination of the laser beam with respect to the optical axis Ax at the deflecting reference point H, and the deviation of the laser beam from the deflecting reference point H can be compensated independently by operating the first beam position adjusting system 91 and the second beam position adjusting system 92 in this order, or in reverse order, so that the bright spot displayed on the image screen of the monitor 2 is located on the intersection point of the superimposed lines. In this way, the principal ray of the laser beam can be adjusted to coincide with the optical axis Ax of the modulating optical system 20 without repeatedly operating the first and second beam position adjusting systems 91 and 92.

FIG. 4 is a perspective view of an example of a beam position adjuster 191, which can be used as either the first position adjusting system 91 or the second beam position adjusting system 92.

As shown in FIG. 4, the beam position adjuster 191 includes first and second rectangular prism 191a and 191b having substantially the same shapes and same sizes. The first and second prisms 191a and 191b are arranged such that the inclined surfaces 191c and 191d face each other with a small gap therebetween. Further, the rectangular prisms 191a and 191b are arranged such that the rectangular surfaces 191e and 191f adjacent to the inclined surface are perpendicular to the optical axis Ax of the modulating optical system 20. The first and second rectangular prisms 191a and 191b are supported so as to be rotatable independently about an axis, which is parallel to the optical axis Ax.

As is shown in FIG. 4, the laser beam incident on the rectangular surface 191e of the first prism 191a emerges from the inclined surface 191c. Then, the laser beam is incident on the inclined surface 191d of the second prism 191b, and then emerges from the rectangular surface 191f.

When the inclined surfaces 191c and 191d are parallel to each other (i.e., the first and second prisms 191a and 191b are located at initial positions), the laser beam before and after passing through the beam position adjuster 191 are also parallel to each other. If one or both of the first and second prisms 191a and 191b are rotated so that their inclined surfaces 191c and 191d are not parallel to each other, the laser beam passed through the beam position adjuster 191 inclines with respect to the incident laser beam by an angle corresponding to the relative rotation of the first and second prisms 191a and 191b. Thus, if the laser beam incident on the beam position adjuster 191 inclines with respect to the optical axis Ax, it can be compensated so that the principal ray of the laser beam becomes parallel to or coincides with the optical axis Ax. It should be noted that, if the beam position adjuster of this type is used as the first beam position adjusting system 91 and/or the second beam position adjusting system 92 shown in FIG. 1, the optical axis on the upstream and downstream sides of the beam adjuster should be shifted so as to meet the shifting amount caused by the first and second prisms 191a and 191b at the initial positions.

FIG. 5 shows a perspective view of a beam position adjuster 291, which is an another example of the first beam position adjusting system 91 or the second beam position adjusting system 92. In this example, the beam position adjuster 291 includes a mirror 291g for reflecting the laser beam directed from the first lens group 21a toward the second lens group 21b. The mirror 291g is rotatable about two rotation axes 291h and 291i which are perpendicular to each other and intersect with each other within the reflecting surface of the mirror 291g, at a point 291j which is substantially the center of the reflecting surface. The inclination of the reflected laser beam can be adjusted so that its principal ray becomes parallel to or coincides with the optical axis of the second lens group 21b by suitably rotating the mirror 291g around either or both of the rotating axes 291h and 291i.

It should be noted that, if the beam position adjuster 291 shown in FIG. 5 is utilized as the first beam position adjusting system 91, the arrangement of the laser source 10, beam bender 15, and the components of the modulating optical system 20 should be modified so that the optical axis of the modulating optical system 20 is appropriately changed to meet the angular range changeable by the mirror 291g. It should be noted that the beam position adjusting system 92 may have the similar structure, and in such a case, the arrangement of the elements may also be changed appropriately so that the mirror 291g functions as the beam position adjusting system 92.

Second Embodiment

FIGS. 6A, 6B, 7A and 7B show developed paths of the laser beam in the laser imaging apparatus 1, which employs beam position adjusting system 93 and 94 according to a second embodiment.

The arrangement of the optical elements shown in FIGS. 6A, 6B, 7A and 7B are similar to that shown in FIGS. 2A, 2B, 3A and 3C except that the beam position adjusting systems 91 and 92 are replaced with the beam position adjusting systems 93 and 94. Therefore, the same reference numerals are assigned to the same elements, and the description thereof will not be repeated.

FIGS. 6A and 6B show developed paths of the laser beam in the laser imaging apparatus 1 when the laser source 10 is implemented in the apparatus such that the principal ray of the laser beam incident on the deflecting surface of the polygonal mirror 30 is inclined with respect to the optical axis Ax of the modulating optical system 20 (in other words, the laser source is shifted with respect to the optical axis Ax). In the drawings, the broken line represents an optical path when the beam position is not adjusted using the beam position adjusting system 93.

In this case, the beam position adjusting system 93 is arranged at or in the close vicinity of the rear focal point of the second lens group 21b. The beam position adjusting system 93 is configured to shift the optical path within a predetermined shiftable range. That is, the optical path of the beam incident on the beam position adjusting system 93 and that of the beam emerging from the beam position adjusting system 93 are shifted from each other.

As shown in FIG. 6A, the beam emerged from the second lens group 21b is shifted from the optical axis Ax. Due to the above-described function of the beam position adjusting system 93, the principal ray of the beam emerged from the beam position adjusting system 93 coincides with the optical axis Ax.

FIG. 6C schematically shows an image display screen of the monitor 2 which receives the image signal output by the beam position detector 80 and displays a bright spot (which is represented by a white circle in FIG. 6C).

It should be noted that direction and distance of the bright spot with respect to the center of the screen represent direction and deviation amount of the laser beam emitted by the laser source 10, respectively.

By adjusting the shifting amount of the principal ray of the laser beam with use of the first beam position adjusting system 93, the bright spot can be located at the intersection point of the superimposed lines, i.e., the optical path is changed such that the laser beam on the downstream of the first beam position adjusting system 93 proceeds along the optical axis Ax, and the bright beam spot is displayed at the position indicated by black circle in FIG. 6C.

It should be noted, the first beam position adjusting system 93 may be provided at or in the close vicinity of any position that is in conjunction with the rear focal point of the imaging optical system 40. Thus, the first beam position adjusting system 93 may be provided between the fourth lens group 22b and the collimating lens 28, for example.

FIGS. 7A and 7B show developed paths of the laser beam in the laser imaging apparatus 100 when the laser beam incident on the deflecting surface deviates from the deflecting base point H (i.e., the laser source is inclined with respect to the optical axis Ax).

The solid and broken lines show, respectively, the paths of the laser beam with and without an adjustment of the laser beam position using the second beam position adjusting system 94. The broken line overlaps with the solid line between the laser source 10 and the second beam position adjusting system 94.

In this case, the second beam position adjusting system 94 is arranged at or in the close vicinity of the rear focal point of the first lens group 21a. The second beam position adjusting system 94 is also configured to shift the optical path within a predetermined shiftable range. That is, the optical path of the beam incident of the beam position adjusting system 94 and that of the beam emerging therefrom are shifted from each other, the shiftable amount being changeable.

As shown by solid line in FIG. 7A, the beam emerged from the first lens group 21a is shifted from the optical axis Ax. Due to the above-described function of the beam position adjusting system 94, the principal ray of the beam emerged from the beam position adjusting system 94 coincides with the optical axis Ax.

FIG. 8 is a perspective view of an example of a beam position adjuster 193, which can be used as either the first position adjusting system 93 or the second beam position adjusting system 94.

The beam position adjuster 193 has a glass plate of a predetermined thickness. The beam position adjuster 193 is rotatable about two rotation axes, which are perpendicular to the optical axis Ax of the modulating optical system 20, and are also perpendicular to each other. Preferably, the two rotation axes intersect each other within the glass plate. The laser beam enters the glass plate from its front surface 193a and exits from the rear surface 193b. The glass plate is neutrally oriented such that the front surface thereof is perpendicular to the optical axis Ax of the modulating optical system 20. With this configuration, a laser beam parallel to the optical axis Ax passes through the glass plate without being shifted in any direction. If the glass plate is rotated about either or both of the two rotation axes, the laser beam passed through the glass plate is shifted by an amount and in a direction corresponding to the rotation angle and direction of the glass plate. Thus, the principal ray of the laser beam can be shifted so that it coincides with the optical axis Ax by suitably rotating the glass plate.

FIG. 9 shows a perspective view of another example of a beam position adjuster 293, which can also be used as the first beam 93 and/or the second beam position adjusting systems 93 and 94. In this example, the beam position adjuster 293 includes two mirrors (293c and 293d) fixed on a plate 293e. One of the mirrors (93c) reflects the incident laser beam, which is parallel with the surface of the plate 293e substantially at a right angle within a plane parallel to the plate 293a. The other mirror (293d) reflects the incident laser beam in a direction perpendicular to the plate 293e. The plate 293e is movable within a plane parallel to the plate 293e. When the plate 293e is moved, the laser beam reflected by the first beam position adjuster 93 moves for a distance and in a direction that corresponds to the distance and direction the plate 93 is moved.

It should be noted that, if the beam position adjuster 293 shown in FIG. 9 is utilized as the beam position adjusting system 93 or 94, the arrangement of the optical elements shown in FIG. 1 should be modified so that the optical axis of the modulating optical system 20 is appropriately changed to meet the optical path formed by the beam position adjuster 293.

It should be appreciated that even though numerous characteristics and advantages of the present invention have been set forth in the foregoing description, together with details of the structure and functions of the invention, the disclosure is illustrative only, and various changes may be made without departing from the gist of the invention.

The first and second beam position adjusting systems do not necessarily need to be of the same type. One of them may be one which adjusts the position of the laser beam by bending the optical path, and the other may be one which adjusts the position of the laser beam by shifting the optical path.

In this case, the first and second beam adjusters can be provided at the same place, or between the same two lenses of the modulating optical system 20. This is because the beam shifting type adjusting systems do not necessarily need to be provided at a point which is in conjugation with the deflecting base point H or the rear focal point I of the imaging optical system 40. Thus, the beam position adjuster of beam shifting type may be provided next to the beam position adjuster of beam refracting type, which have to be provided at a point in conjugation with the deflecting base point H or the rear focal point I of the imaging optical system 40.

The present disclosure relates to the subject matter contained in Japanese Patent Application No. 2000-392504, filed on Dec. 25, 2000, which is expressly incorporated herein by reference in its entirety.

What is claimed is:

1. A laser imaging apparatus, comprising:
   a laser source that emits a laser beam;
   a relaying optical system including a plurality of lens elements, said relaying optical systems relaying the laser beam emitted by said laser source;
   a deflector having at least one deflecting surface that deflects the laser beam relayed by said relaying optical system;
   an imaging optical system that converges said laser beam deflected by said at least one deflecting surface to form a beam spot on a surface to be scanned, an optical axis of said relaying optical system and an optical axis of said imaging optical system intersecting at a deflection reference point which is located in the vicinity of said at least one deflecting surface;
   a first adjusting system that compensates for an inclination error of the laser beam incident on said at least one deflecting surface, said first adjusting system being provided in said relaying optical system; and
   a second adjusting system that compensates for a positional error of the laser beam incident on said at least one deflecting surface, said second adjusting system being provided in said relaying optical system, wherein said relaying optical system includes a modulator that ON/OFF modulates the laser beam passing therethrough, and wherein said first and second adjusting systems are located on a front side of said modulator.

2. The laser imaging apparatus according to claim 1, wherein a rear focal point of said relaying optical system coincides with said deflection reference point, and wherein a rear focal point of said imaging optical system is on said surface to be scanned.

3. The laser imaging apparatus according to claim 2, wherein said first adjusting system includes an optical system which deflects the laser beam at a point, within said relaying optical system, which is conjugate with the deflection reference point, a deflection amount being adjustable.

4. The laser imaging apparatus according to claim 2, wherein said first adjusting system includes an optical system which deviates the laser beam at a point, within said relaying optical system, which is conjugate with the rear focal point of said imaging optical system or in the close vicinity thereof, a deviation amount being adjustable.

5. The laser imaging apparatus according to claim 2, further comprising a beam position detector that detects an inclination error of a principal ray of the laser beam incident on said at least one deflection surface with respect to the optical axis of said relaying optical system, said beam position detector being located at one of a position conjugate with the rear focal point of said imaging optical system or in the vicinity thereof, and a position optically equivalent to the rear focal point of said imaging optical system or in the vicinity thereof.

6. The laser imaging apparatus according to claim 5, wherein said beam position detector is located on a downstream side of said first adjusting system.

7. The laser imaging apparatus according to claim 2, further including:
   a splitting member that splits the laser beam, said splitting member being located at a position, within said relaying optical system, conjugate with said deflection reference position or in the vicinity thereof;

a relaying lens, said relaying lens being arranged such that a front focal point thereof coincides with a rear focal point of an optical system located on an upstream side of said splitting member; and a beam position detector that receives the laser beam split by said splitting member and passed through said relaying lens, said beam position detector detecting a position at which the laser beam enters.

8. The laser imaging apparatus according to claim 7, wherein said splitting member is located on a rear side of said first adjusting system.

9. The laser imaging apparatus according to claim 2, wherein said second adjusting system includes an optical system that deflects the laser beam at a position, within said relaying optical system, which is conjugate with the rear focal point of said imaging optical system, a deflection direction being adjustable.

10. The laser imaging apparatus according to claim 2, wherein said second adjusting system includes an optical system which deviates the laser beam at a point, within said relaying optical system, which is conjugate with the deflection reference point of said imaging optical system or in the close vicinity thereof, a deviation amount being adjustable.

11. The laser imaging apparatus according to claim 2, further includes a beam position detector that detects a positional error of a principal ray of the laser beam incident on said at least one deflection surface with respect to the optical axis of said relaying optical system as a deviation from the optical axis of said relaying optical system, said beam position detector being located at one of a position conjugate with the rear focal point of said imaging optical system or in the vicinity thereof, and a position equivalent to the rear focal point of said imaging optical system or in the vicinity thereof.

12. The laser imaging apparatus according to claim 11, wherein said beam position detector is located on a downstream side of said second adjusting system.

13. The laser imaging apparatus according to claim 2, further including:

a splitting member that splits the laser beam, said splitting member being located at a position, within said relaying optical system, conjugate with the rear focal point of said imaging optical system or in the vicinity thereof;

a relaying lens, said relaying lens being arranged such that a front focal point thereof coincides with a rear focal point of an optical system located on an upstream side of said splitting member; and a beam position detector that receives the laser beam split by said splitting member and passed through said relaying lens, said beam position detector detecting a position at which the laser beam enters.

14. The laser imaging apparatus according to claim 13, wherein said splitting member is located on a rear side of said second adjusting system.

15. The laser imaging apparatus according to claim 1, wherein a beam emitting point of said laser source is located on a front focal point of said relaying optical system.

16. The laser imaging apparatus according to claim 1, wherein said relaying optical system includes a collimating lens that collimates the laser beam emitted from said modulator.

17. A laser imaging apparatus, comprising:

a laser source that emits a laser beam;

a relaying optical system including a plurality of lens elements, said relaying optical systems relaying the laser beam emitted by said laser source;

a deflector having at least one deflecting surface that deflects the laser beam relayed by said relaying optical system;

an imaging optical system that converges said laser beam deflected by said at least one deflecting surface to form a beam spot on a surface to be scanned, an optical axis of said relaying optical system and an optical axis of said imaging optical system intersecting at a deflection reference point which is located in the vicinity of said at least one deflecting surface;

a first adjusting system that compensates for an inclination error of the laser beam incident on said at least one deflecting surface, said first adjusting system being provided in said relaying optical system; and a second adjusting system that compensates for a positional error of the laser beam incident on said at least one deflecting surface, said second adjusting system being provided in said relaying optical system, wherein said relaying optical system includes at least one reducing optical system that reduces a diameter of the laser beam.

18. A laser imaging apparatus, comprising:

a laser source that emits a laser beam;

a relaying optical system including a plurality of lens elements, said relaying optical systems relaying the laser beam emitted by said laser source;

a deflector that deflects the laser beam emitted by said laser source and relayed by said relaying optical system to scan;

an imaging optical system that converges said laser beam deflected by said deflector to form a scanning beam spot on a surface to be scanned;

a first adjusting system that compensates for an inclination error of the laser beam incident on said deflector, said first adjusting system being provided in said relaying optical system; and a second adjusting system that compensates for a positional error of the laser beam incident on said deflector, said second adjusting system being provided in said relaying optical system, wherein compensation of said first adjusting system and compensation of said second adjusting system do not affect each other, said relaying optical system including a modulator that ON/OFF modulates the laser beam passing therethrough, said first and second adjusting systems being located on a front side of said modulator.

* * * * *